(12) United States Patent
Lundahl

(10) Patent No.: US 10,891,459 B2
(45) Date of Patent: Jan. 12, 2021

(54) FINGERPRINT SENSOR MODULE AND METHOD FOR MANUFACTURING A FINGERPRINT SENSOR MODULE

(71) Applicant: FINGERPRINT CARDS AB, Gothenburg (SE)

(72) Inventor: Karl Lundahl, Gothenburg (SE)

(73) Assignee: FINGERPRINT CARDS AB, Gothenburg (SE)

( * ) Notice: Subject to any disclaimer, the term of this patent is extended or adjusted under 35 U.S.C. 154(b) by 0 days.

(21) Appl. No.: 16/621,302

(22) PCT Filed: Jun. 11, 2018

(86) PCT No.: PCT/SE2018/050608
§ 371 (c)(1),
(2) Date: Dec. 11, 2019

(87) PCT Pub. No.: WO2018/231130
PCT Pub. Date: Dec. 20, 2018

(65) Prior Publication Data
US 2020/0097694 A1     Mar. 26, 2020

(30) Foreign Application Priority Data
Jun. 16, 2017   (SE) ..................................... 1750770

(51) Int. Cl.
*G06K 7/08*      (2006.01)
*G06K 9/00*      (2006.01)
(Continued)

(52) U.S. Cl.
CPC ....... *G06K 9/0002* (2013.01); *G06K 9/00053* (2013.01); *G06K 19/07701* (2013.01);
(Continued)

(58) Field of Classification Search
CPC ............. G06K 9/0002; G06K 9/00053; G06K 9/00006; G06F 21/32
(Continued)

(56) References Cited

U.S. PATENT DOCUMENTS 9,460,332 B1 * 10/2016 Bussat .................... G06F 3/041
2012/0049309 A1 * 3/2012 Kiyomoto .......... G06K 19/0718
257/434
(Continued)

FOREIGN PATENT DOCUMENTS

CN     104303287 A    1/2015
CN     106293239 A    1/2017
(Continued)

OTHER PUBLICATIONS

PCT International Search Report and Written Opinion dated Sep. 27, 2018 for International Application No. PCT/SE2018/050608, 12 pages.

*Primary Examiner* — Jamara A Franklin
(74) *Attorney, Agent, or Firm* — RMCK Law Group, PLC

(57) ABSTRACT

There is provided a fingerprint sensor module comprising a fingerprint sensor device comprising a sensing array and at least one connection pad for electrically connecting the fingerprint sensor device to external circuitry, the sensing array and connection pad being located on a first side of the fingerprint sensing device; at least one electrically conductive via connection arranged adjacent to the fingerprint sensor device and in electrical contact with the connection pad via at least one conductive trace located in the same plane as the connection pad; a mold layer arranged to cover a backside of the fingerprint sensor device and to fill a volume between the fingerprint sensor device and the via connection, wherein an end portion of the via connection is exposed for connecting the fingerprint sensor module to (Continued)

external circuitry. There is also provided a method for manufacturing such a fingerprint sensor module.

19 Claims, 6 Drawing Sheets

(51) Int. Cl.
*G06K 19/077* (2006.01)
*H01L 21/48* (2006.01)
*H01L 21/56* (2006.01)
*H01L 21/683* (2006.01)
*H01L 23/31* (2006.01)
*H01L 23/538* (2006.01)
*H01L 23/00* (2006.01)

(52) U.S. Cl.
CPC ........ *H01L 21/4853* (2013.01); *H01L 21/565* (2013.01); *H01L 21/568* (2013.01); *H01L 21/6835* (2013.01); *H01L 23/3121* (2013.01); *H01L 23/5386* (2013.01); *H01L 23/5388* (2013.01); *H01L 23/5389* (2013.01); *H01L 24/19* (2013.01); *H01L 24/20* (2013.01); *H01L 2221/68372* (2013.01); *H01L 2224/214* (2013.01)

(58) Field of Classification Search
USPC .............. 235/380, 382, 492, 451; 382/124; 340/5.53, 5.93
See application file for complete search history.

(56) References Cited

U.S. PATENT DOCUMENTS

2012/0256280 A1 10/2012 Erhart et al.
2015/0102829 A1 4/2015 Son et al.
2016/0099210 A1 4/2016 Kwon et al.

FOREIGN PATENT DOCUMENTS

| CN | 106779014 A | 5/2017 |
| KR | 20160091253 A | 8/2016 |
| WO | 2016190678 A1 | 12/2016 |

\* cited by examiner

FINGERPRINT SENSOR MODULE AND METHOD FOR MANUFACTURING A FINGERPRINT SENSOR MODULE

CROSS-REFERENCE TO RELATED APPLICATIONS

This application is a 371 U.S. National Stage of International Application No. PCT/SE2018/050608, filed Jun. 11, 2018, which claims priority to Swedish Patent Application No. 1750770-8, filed Jun. 16, 2017. The disclosures of each of the above applications are incorporated herein by reference in their entirety.

FIELD OF THE INVENTION

The present invention relates to a fingerprint sensor module for a smart card and to a method for manufacturing such a fingerprint sensor module.

BACKGROUND OF THE INVENTION

Various types of biometric systems are used more and more in order to provide increased security and/or enhanced user convenience. In particular, fingerprint sensing systems have been adopted in, for example, consumer electronic devices, thanks to their small form factor, high performance, and user acceptance.

Among the various available fingerprint sensing principles (such as capacitive, optical, thermal etc.), capacitive sensing is most commonly used, in particular in applications where size and power consumption are important issues. All capacitive fingerprint sensors provide a measure indicative of the capacitance between each of several sensing structures and a finger placed on or moved across the surface of the fingerprint sensor.

Moreover, fingerprint sensor integration in smart cards is increasingly requested by the market. However, the requirements of the fingerprint sensor in a smart card may be different compared to when the sensor is used in a smartphone.

Currently industrialized technologies for high volume production of smart cards calls for a semiconductor package with the interconnects facing down towards the smart card. Due to the materials involved, such as anisotropic conductive adhesives- or films, (ACA, ACF) utilized for the fabrication of the electrical connection between the semiconductor package pads and the receiving pads in the smart cards, the dimensions of such pads need to have substantially larger dimensions than what is typically used for a semiconductor package. A connection on the backside of the semiconductor package can for example be achieved using through-silicon-via connections (TSVs). However, TSVs are both costly and complicated to manufacture, and there is also a need to form a contact pad having a larger area than the via connections, thereby requiring additional process steps.

Accordingly, there is a need for an improved fingerprint sensor module suitable for smart card integration, and for a method for manufacturing such a fingerprint sensor module.

SUMMARY

In view of above-mentioned and other drawbacks of the prior art, it is an object of the present invention to provide an improved fingerprint sensor module and a method for manufacturing such a fingerprint sensor module.

According to a first aspect of the invention, there is provided a fingerprint sensor module comprising a fingerprint sensor device comprising a sensing array and at least one connection pad for electrically connecting the fingerprint sensor device to external circuitry, the sensing array and connection pad being located on a first side of the fingerprint sensing device; at least one electrically conductive via connection arranged adjacent to the fingerprint sensor device and in electrical contact with the connection pad via at least one conductive trace located in the same plane as the connection pad; a mold layer arranged to cover a backside of the fingerprint sensor device and to fill a volume between the fingerprint sensor device and the via connection, wherein an end portion of the via connection is exposed for connecting the fingerprint sensor module to external circuitry.

The fingerprint sensor module can be considered to comprise the fingerprint sensor device and a package structure at least partially enclosing the fingerprint sensor device. The sensing array of the fingerprint sensor device is an array comprising a plurality of individual sensing elements, which may also be referred to as pixels. In a capacitive fingerprint sensing device, each sensing element comprises an electrically conductive plate and associated sensing and readout circuitry for detecting a capacitive coupling between each sensing element and a finger placed on a sensing surface of the fingerprint sensor module. It should however be noted that various embodiments of the present invention are equally applicable for other types of fingerprint sensor devices, such as optical, thermal and ultrasonic fingerprint sensor devices.

The fingerprint sensor device must be connected to external circuitry to be able to communicate with a device or component in which the fingerprint sensor device is arranged. Such an electrical connection is often formed using either wire bonding from the fingerprint sensor device to an underlying substrate, or by means of a through-silicon via connection (TSV) through the fingerprint sensor device substrate, which for a capacitive fingerprint sensor device often is a silicon substrate.

The present invention is based on the realization that a via connection for connecting the fingerprint sensor device to external circuitry advantageously may be placed adjacent to the fingerprint sensor device and electrically connected to the fingerprint sensor device using a conductive trace. Thereby, the via connection will not take up valuable chip area on the fingerprint sensor device itself. This in turn means that that the size, i.e. the cross-section area, of the via connection can be freely adapted to the properties of the external circuitry without having to take the design of the fingerprint sensor chip into account. Accordingly, the described via connection can be made larger compared to what would be feasible for a TSV in the fingerprint sensor device. A larger via connection in turn provides better heat conduction through the via connection. As will be described in further detail in the following, an increased heat conduction capability of the via connection simplifies the integration of the fingerprint sensor module in a smart card component since it enables efficient curing of an adhesive used when arranging the fingerprint sensor module in the smart card.

A fingerprint sensor module may comprise a plurality of the described via connections, and the number, locations and geometry of the via connection can in principle be selected arbitrarily and tailored to the requirements set by the fingerprint sensor device and by the component in which the fingerprint sensor module is to be integrated.

The mold layer is arranged to protect the backside of the fingerprint sensor device and also to fill gaps or voids between the sensor device and the via connection, while leaving the end portion of the via connection exposed to enable an electrical connection to the via connection.

According to one embodiment of the invention, a height of the electrically conductive via connection may advantageously be lower than a combined thickness of the sensor device and the mold layer located on the backside of the sensor device. Thereby, the difference in height results in a fingerprint sensor module having a step between the exposed end portion of the via connection and the backside of the fingerprint sensor module formed by the mold layer.

According to one embodiment of the invention, the fingerprint sensor module may further comprise electrically conductive via connections arranged on at least two opposing sides of the fingerprint sensor device such that said fingerprint sensor module exhibits a T-shaped profile. If there are via connections on two or more sides of the fingerprint sensor device (which typically is square or rectangular as seen from above), a fingerprint sensor module having a T-shaped profile is formed. A T-shaped fingerprint sensor module is advantageous for smart card integration where the fingerprint sensor module can be arranged in a corresponding recess of the smart card having an inverted T-shape and electrically connected to the smart card by means of the exposed end portions of the via connections.

According to one embodiment of the invention, a height of the at least one electrically conductive via connection may be equal to a thickness of the fingerprint sensor device. Hereby, a T-shaped module can easily be formed where the mold layer protrudes from the backside of the sensor device to form the base of the T-shape.

According to one embodiment of the invention, the conductive trace may be formed in a redistribution layer, RDL. By using RDL, auxiliary components and devices can easily be connected to and incorporated in the fingerprint sensor module. Moreover, the formation of an RDL is a standard process in semiconductor manufacturing and can thereby be easily implemented in the method for manufacturing the fingerprint sensor module.

According to one embodiment of the invention, the at least one electrically conductive via connection may advantageously comprise copper. Copper is both a good electrical conductor as well as a heat conductor. Thereby, the desired heat conduction properties can be achieved by using copper via connections.

According to one embodiment of the invention, the at least one electrically conductive via connection may advantageously be formed by means of electroplating. By using electroplating, relatively thick metal layers can be easily formed. Moreover, a large cross-section area of the via connection is easily achieved using electroplating.

According to one embodiment of the invention, the at least one electrically conductive via connection may be integrated in a pre-fabricated substrate. Thereby, the via connections can be made using any suitable manufacturing method without having to consider the fingerprint sensor device which may be sensitive to certain manufacturing steps, such as steps requiring high temperatures. The fingerprint sensor device is in many cases manufactured using a CMOS-based manufacturing process, which puts temperature restraints on following manufacturing steps for forming the fingerprint sensor module. Accordingly, by pre-forming the via connections, in a pre-fabricated substrate, the fingerprint sensor device can simply be placed in the appropriate position in relation to the via connections and subsequently connected by means of conductive traces on the top side of the fingerprint sensor device, i.e. on the side comprising the sensing array.

According to one embodiment of the invention, the substrate in which the via connections are formed may advantageously be a PCB-substrate, which is readily adaptable and usable in existing manufacturing processes.

According to one embodiment of the invention, a cross section area of the electrically conductive via connection may be larger than a surface area of a corresponding connection pad of the fingerprint sensor device. Thereby, the size of the via connection is in no way limited by the size of the connection pad of the fingerprint sensor device. Accordingly, the footprint area of the fingerprint sensor device used for connection pads for connecting to external circuitry can be minimized. A size of a connection pad of the fingerprint sensor device is typically in the range of 50-100 micrometers, whereas a size of the via connection, e.g. for connecting the fingerprint sensor module to a smart card, preferably is in the range of 0.5 to 3 millimeters.

According to one embodiment of the invention the mold layer may advantageously comprise a mechanically flexible material. This may in turn lead to that the entire fingerprint sensor module exhibits a certain degree of flexibility which is advantageous for a fingerprint sensor module integrated in a smart card. In particular, a rigid fingerprint sensor module is more likely to break if the smartcard and consequently the fingerprint sensor module is bent.

According to one embodiment of the invention, the fingerprint sensor module may further comprise a protective plate arranged to cover the fingerprint sensor device and to form a sensing surface of the fingerprint sensor module. The protective plate typically comprises a dielectric material in order to provide a good capacitive coupling between a finger placed on the plate and the sensing elements of the sensing chip. In particular the protective plate may advantageously comprise a glass or ceramic material, such as a chemically strengthened glass, $ZrO_2$ or sapphire. The above materials all provide advantageous properties in that they are hard and resistant to wear and tear, and in that they are dielectric thereby providing a good capacitive coupling between a finger placed on the surface of the protective plate and the sensing element of the sensing device. The protective plate described herein commonly forms the outer surface of the fingerprint sensing module.

There is also provided a smart card comprising a fingerprint sensor module according to any one of the aforementioned embodiments, wherein the fingerprint sensor module is arranged in an opening of the smart card and electrically connected to smart card circuitry by means of the at least one electrically conductive via connection.

According to a second aspect of the invention, there is provided a method for manufacturing a fingerprint sensor module, the method comprising: providing a carrier; providing a fingerprint sensor device comprising a sensing array and at least one connection pad for electrically connecting the fingerprint sensor device to external circuitry, the sensing array and connection pad being located on a first side of the fingerprint sensing device; arranging the fingerprint sensor device on the carrier with the sensing array facing the carrier; providing at least one at least one electrically conductive via connection on the carrier adjacent to the fingerprint sensor device; arranging a mold layer to cover a backside of the fingerprint sensor device and to enclose the at least one at least one electrically conductive via connection while leaving an end portion of the at least one electrically conductive via connection exposed; removing the carrier; and forming an electrical connection between the at least one connection pad and the at least one at least one electrically conductive via connection.

By means of the described method, a fingerprint sensor module comprising via connections adjacent to the fingerprint sensor device can be manufactured.

According to one embodiment of the invention the at least one electrically conducive via connection may be provided on the carrier prior to arranging the fingerprint sensor device on the carrier.

According to one embodiment of the invention, arranging a mold layer may comprise depositing a mold layer to cover a backside of the fingerprint sensor and the at least one electrically conductive via connection; and removing a portion of the mold layer to expose at least an end portion of the at least one at least one electrically conductive via connection. Accordingly, the mold layer can be provided on the backside of the fingerprint sensor device without having to take the locations of the via connections into consideration during deposition of the mold material. Thereby, a lower precision is required when depositing the mold layer which in turn leads to a simplified process.

According to one embodiment of the invention, the portion of the mold layer covering the end portions of the via connection may advantageously be removed by means of laser ablation. Laser ablation is a method for removing material having high precision and which can be performed at high speed. Moreover, the relatively large via connections can efficiently lead heat away from the ablated area.

According to one embodiment of the invention, the method may further comprise arranging a mold layer by means of a patterned molding tool having a pattern such that a resulting mold does not cover the end portion of the at least one electrically conductive via connection. A mold material is then deposited on the backside of the fingerprint sensor device, followed by patterning and curing of the mold material using the molding tool. The mold material may be a low viscosity fluid, or solid granules which are heated and melted during molding According to one embodiment of the invention, forming an electrical connection between the at least one connection pad and the at least one electrically conductive via connection is performed by deposition of an electrically conductive redistribution layer, RDL.

Additional effects and features of the second aspect of the invention are largely analogous to those described above in connection with the first aspect of the invention.

Further features of, and advantages with, the present invention will become apparent when studying the appended claims and the following description. The skilled person realize that different features of the present invention may be combined to create embodiments other than those described in the following, without departing from the scope of the present invention.

BRIEF DESCRIPTION OF THE DRAWINGS

These and other aspects of the present invention will now be described in more detail, with reference to the appended drawings showing an example embodiment of the invention, wherein.

DETAILED DESCRIPTION OF EXAMPLE EMBODIMENTS

In the present detailed description, various embodiments of the system and method according to the present invention are mainly described with reference to a capacitive fingerprint sensor device. However, various embodiments of the invention are equally applicable also to other types of fingerprint sensors, such as optical, ultrasound and thermal fingerprint sensors.

Figure 1:
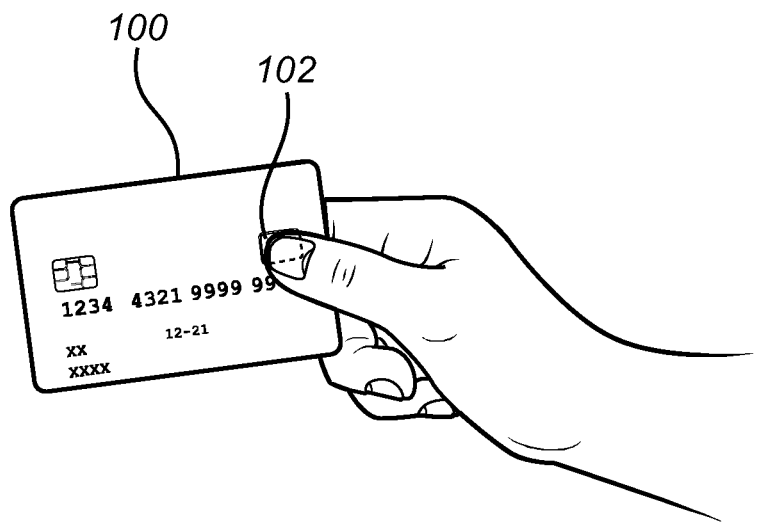
FIG. 1 schematically illustrates a smart card according to an embodiment of the invention.

FIG. 1 schematically illustrates a smart card 100 comprising a fingerprint sensor module 102 according to an embodiment of the invention.

Figure 2:
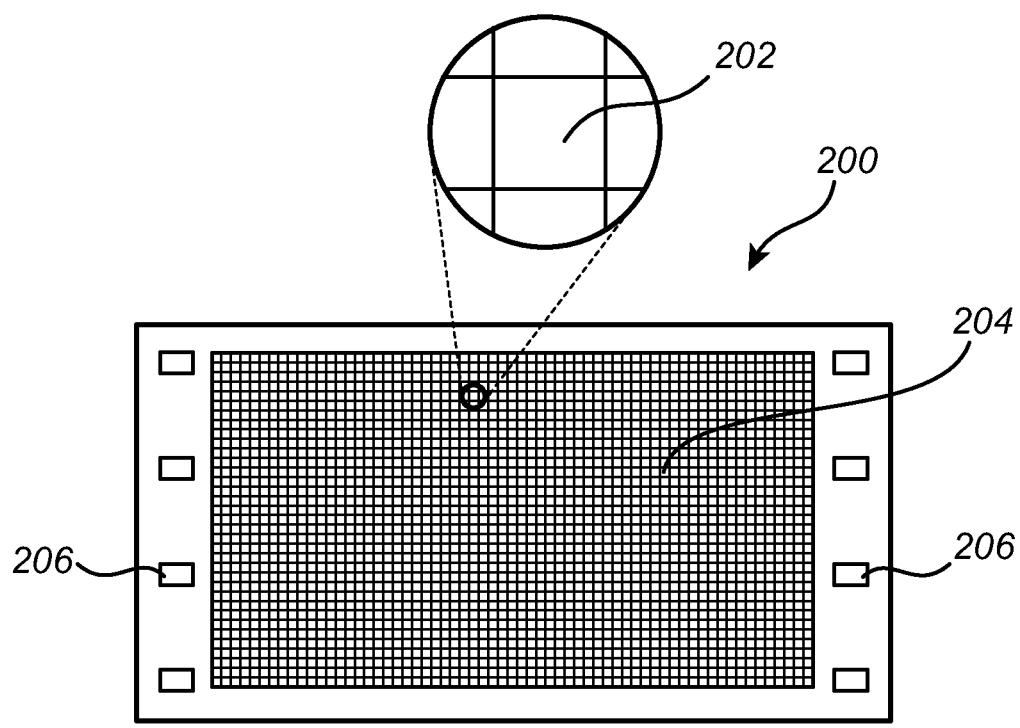
FIG. 2 schematically illustrates a fingerprint sensing device comprised in a fingerprint sensing module according to an embodiment of the invention.

FIG. 2 schematically shows the fingerprint sensor device 200 comprised in the smart card 100 in FIG. 1. As can be seen in FIG. 2, the fingerprint sensor device 200 comprises a plurality of sensing elements 202 arranged in a sensor array 204. The fingerprint sensor device 200 further comprises connection pads 206 for example forming a power supply interface and a communication interface. The sensor array 204 comprises a large number of sensing elements 202, each sensing element 202 being controllable to sense a distance between an electrically conductive sensing structure comprised in the sensing element and the surface of a finger contacting a sensing surface of the sensor device 200. In the present context, the sensing surface of the fingerprint sensor device 200 will be the outer surface of the fingerprint sensor module 102.

Figure 3:
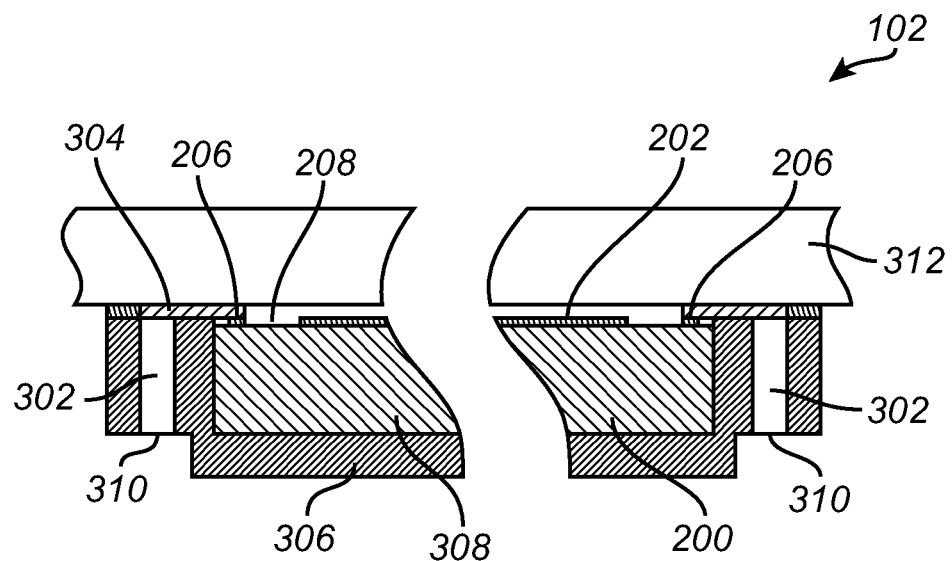
FIG. 3 schematically illustrates a fingerprint sensing module according to an embodiment of the invention.

FIG. 3 schematically illustrates a partial cross section of a fingerprint sensor module 102 according to an embodiment of the invention. The fingerprint sensor module 102 comprises a fingerprint sensor device 200 comprising a sensing array 204 consisting of a plurality of sensing elements 202, and a plurality of connection pads 206 for electrically connecting the fingerprint sensor device 200 to external circuitry. The sensing array 204 and the connection pads 206 are located on a first side 208 of the fingerprint sensor device 200, which can be referred to as the front side or the upside of the fingerprint sensor device 200 since it is the side comprising the active sensing array 204.

The fingerprint sensor module 102 further comprises electrically conductive via connections 302 arranged adjacent to the fingerprint sensor device 102 and in electrical contact with the connection pad via at least one conductive trace 304 located in the same plane as the connection pad 206. The conductive trace 304 is an electrically conductive line or conductor, typically made from copper. The electrically conductive via connections 302 may for example be copper via connections 302 having been formed by electroplating. Moreover, the via connections 302 are arranged separately and at a distance from the fingerprint sensor device 200.

The fingerprint sensor module 102 further comprises a mold layer 306 arranged to cover a backside 308 of the fingerprint sensor device 200 and to fill a volume between the fingerprint sensor device 200 and the via connection 302. An end portion 310 of the via connection 302 is exposed for connecting the fingerprint sensor module 102 to external circuitry. The end portion 310 is facing in the same direction as the backside 308 of the fingerprint sensor device 200. The mold layer 306 protects the backside 308 of the fingerprint sensor module 302 and the via connections 302 such that a fingerprint sensor module 302 is provided which is ready for integration in a user device such as a smart card or a smartphone.

As further illustrated in FIG. 3, the fingerprint sensor module 302 has a T-shaped profile to facilitate mounting and connection of the module 302 in a smart card having a corresponding recess having an inverted T-shape profile as will be illustrated in the following. The T-shape is achieved by configuring the fingerprint sensor module 102 such that a height of the via connection 310 is lower than a combined thickness of the fingerprint sensor device 102 and the mold layer 306 located on the backside 308 of the fingerprint sensor device 102. Here, a height of the via connection 310 is the same as the thickness of the fingerprint sensor device 102 which simplifies formation of the T-shaped profile. The illustrated T-shape can be achieved by shaping the mold material, even if there are not via connections 302 on two or more sides of the fingerprint sensor device 200. Accordingly, the T-shape can be defined by the mold layer 306 irrespective of the configuration of the via connections 302.

The fingerprint sensor module 302 may further comprise one or more passive or active components (not shown), where the passive components may be associated with functionality of the fingerprint sensor device 200 and the active components may comprise control circuitry for the fingerprint sensor device 200. Such additional passive or active components may be arranged adjacent to the fingerprint sensor device 200 or on the backside 308 of the fingerprint sensor device 200. Moreover, the components may be connected either directly to the fingerprint sensor device or they may be configured to be connected to external circuitry by means of via connections in a similar manner as described above.

The fingerprint sensor module 302 illustrated in FIG. 3 further comprises a cover structure 312. The cover structure may comprise an encapsulant. The cover structure 312 may further comprise a plurality of layers, such as an adhesive, a pigment layer, a dielectric layer and a top surface coating. The cover structure 312 may also comprise a protective plate 312 in the form of a glass or ceramic plate. Moreover, the cover structure 312 may be part of a display glass for in an electronic device such as a smartphone.

Figure 4:
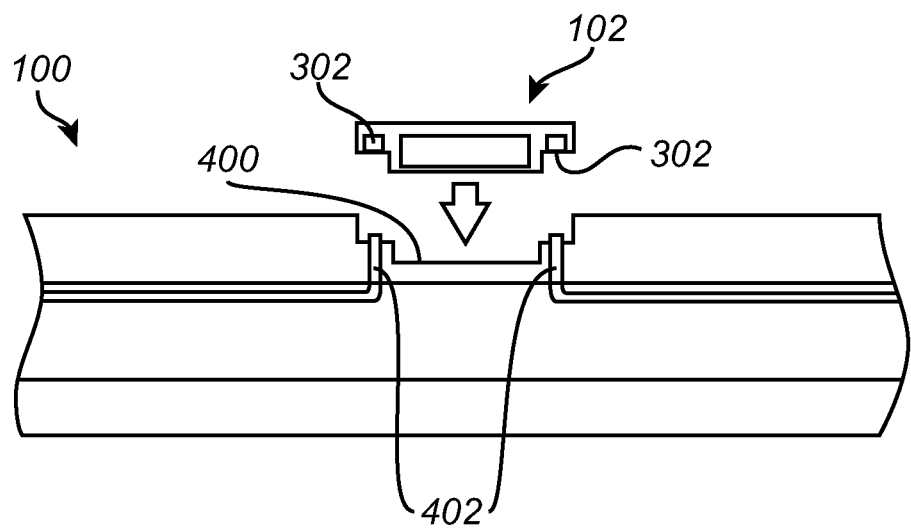
FIG. 4 schematically illustrates a fingerprint sensing module and a smart card according to an embodiment of the invention.

FIG. 4 schematically illustrates the assembly of a T-shaped fingerprint sensor module 102 in a smart card 100. The smart card 100 comprises an opening in the form of a recess 400 having an inverted T-shape corresponding to the T-shape of the sensor module 102. Here, it can be seen that the end portions 310 of the via connections 302 are located such that they can form an electrical connection with corresponding via connections 402 of the smart card 100. The fingerprint sensing module 102 is advantageously attached to the smart card substrate using a conductive adhesive or a conductive solder material at the locations of the via connections 402. The fingerprint sensor module 102 can for example be placed in the smart card 100 using a pick-and-place process.

Figure 5:
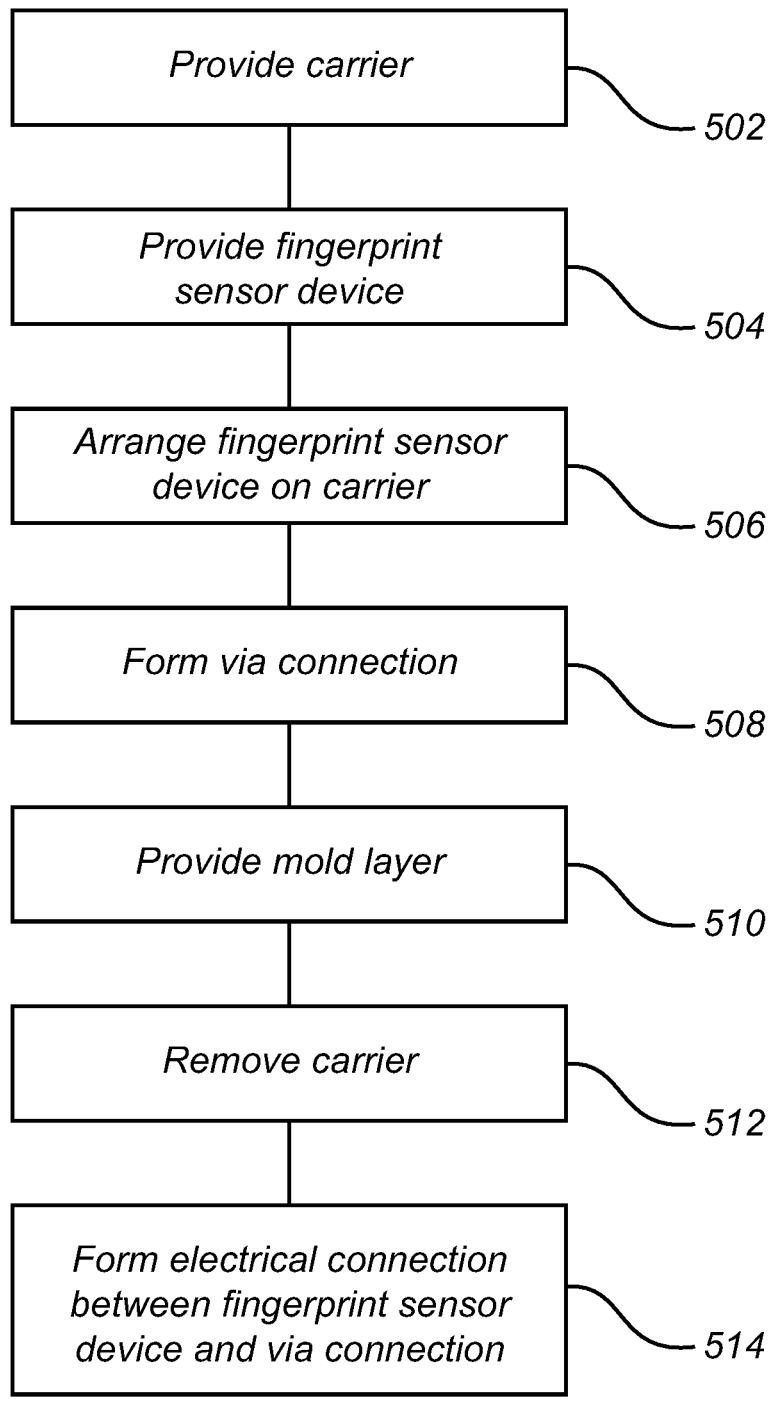
FIG. 5 is a flow chart outlining the general steps of a method for manufacturing a fingerprint sensor module according to an embodiment of the invention.

FIG. 5 is a flow chart outlining the general steps of a method for manufacturing a fingerprint sensor module 102 according to an embodiment of the invention. The method will be described with further reference to FIGS. 6A-D schematically illustrating selected steps of the method.

Figure 6A:
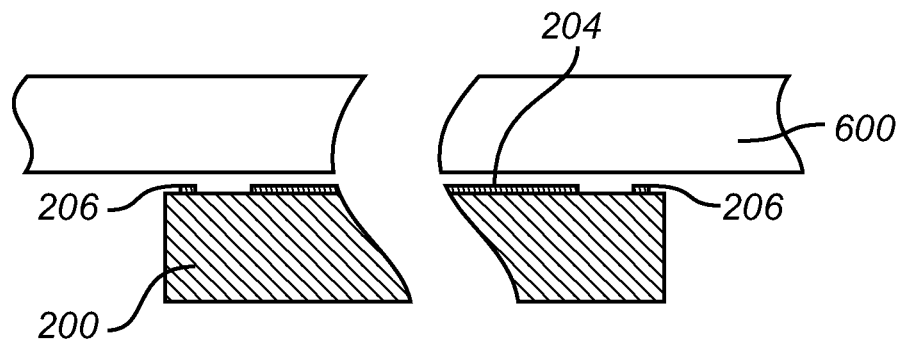
FIGS. 6A-D schematically illustrate steps of a manufacturing method according to an embodiment of the invention.
Figure 6B:
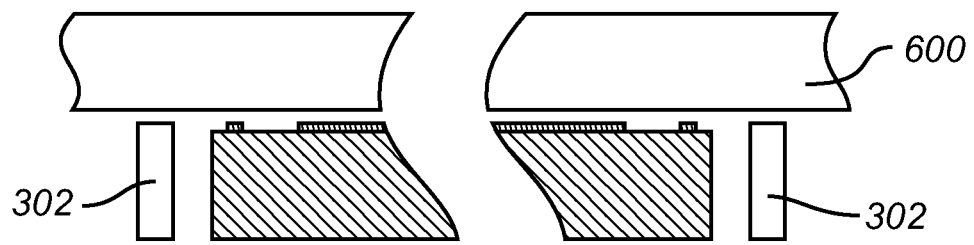
Figure 6C:
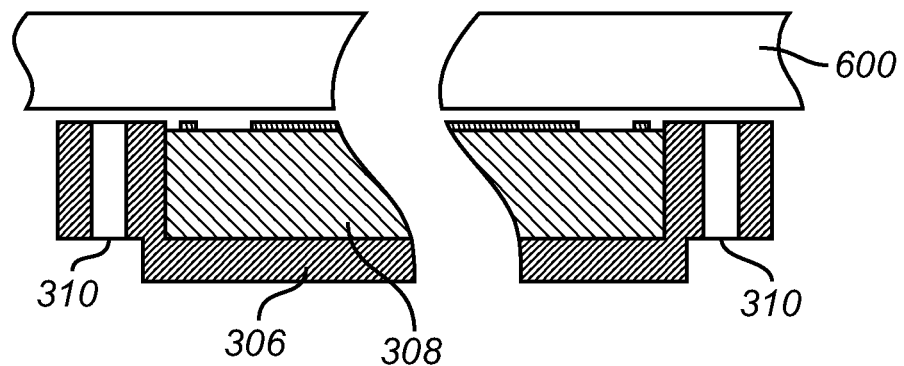

The method comprises providing 502 a carrier 600, providing 504 a fingerprint sensor device 200 and arranging 506 the fingerprint sensor device 200 as described above in relation to FIG. 2 on the carrier 600 with the sensing array 204 facing the carrier 600 as illustrated in FIG. 6A. The carrier 600 may for example be a glass wafer or a panel wafer, which in turn may comprise an adhesive film or tape to attach the fingerprint sensor device 200 to the carrier 600.

Next, electrically conductive via connections 302 are formed 508 on the carrier 600 adjacent to the fingerprint sensor device 200. The electrically conductive via connections 302 are advantageously formed 508 by means of electroplating of copper. It should be noted that the illustrations are not drawn to scale. In practice, the size of the connection pad is typically in the range of 50×50 µm, while the size (i.e. the side of a rectangular connection or the diameter of a circular connection) of the via connection can be in the range of 0.5 to 3 mm. The size of the via connection 302 can be determined based on the requirements of the device in which the fingerprint sensor module 102 is to be arranged. One of the advantages of forming the via connections 302 outside of the fingerprint sensor device 200 itself is that they can be made significantly larger compared to conventional through-silicon via (TSV) connections. Moreover, electroplating can be used to form via connections 302 having an arbitrary size. It is to be understood that standard lithography and masking procedures for electroplating may be employed to form the desired pattern and configuration of via connections 302.

In the following step, a mold layer 306 is provided to cover a backside 308 of the fingerprint sensor device 200 and to enclose the electrically conductive via connection 302. The mold layer 306 is arranged so that an end portion 310 of the electrically conductive via connection 320 is exposed. The mold layer 306 can be provided in the form of a low viscosity fluid or in the form of solid granules which are subsequently melted and cured during a molding process. Moreover, the mold layer 306 can be shaped to expose the end portions 310 of the via connections 302 by using a T-shaped molding tool. The mold layer 306 can also be formed by first providing a homogeneous layer covering both the fingerprint sensor device 200 and the end portions 310 of the via connections 302. Selected portions of the mold layer 306 are subsequently removed, for example using laser ablation, to expose the end portions 310.

Once the mold layer 306 is completed, the carrier 600 is removed 512, or the fingerprint sensor module 102 is removed from the carrier 600. When the front side of the fingerprint sensor device 200 comprising the connection pads 206 is exposed, the electrical connection 304 between the connection pad 206 and the electrically conductive via connections 302 can be formed in a redistribution layer as illustrated in FIG. 6D.

A redistribution layer can be deposited by performing the following general steps:
Spin coat protective polyimide layer
Pattern the polyimide layer with openings where the metal will be Deposit seed layer by sputtering (Cu, Ti/Cu multilayer might be used for improved adhesion)
Spin coat thin photoresist
Pattern thin photoresist (leave openings over only the Cu traces and vias)
Electroplate Cu
Strip away the thin photoresist
Etch away un-wanted blanket Cu elsewhere than via and traces.
Apply second protective polyimide layer (blanket dep by spin coating)

The above described process is a commonly used Cu RDL process for silicon-based devices. However, it is also possible to use a Damascene Cu layer process to make the same Cu structure.

Figure 6D:
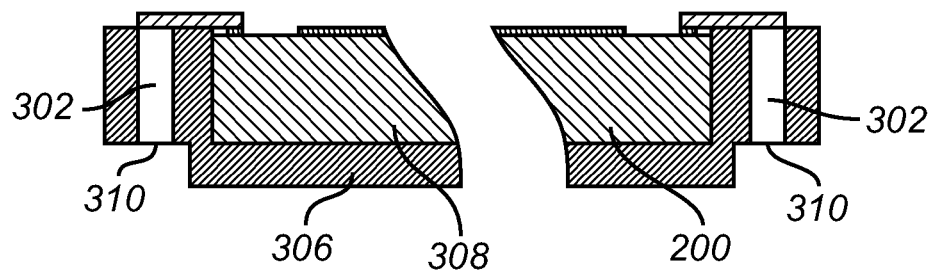

To prepare the fingerprint sensor module 102 for integration in a smart card or in an electronic device, an encapsulation layer 602 and/or a cover plate can be arranged to cover the sensing array 204 and the electrical connections 602, as illustrated in FIG. 6D.

Figure 7:
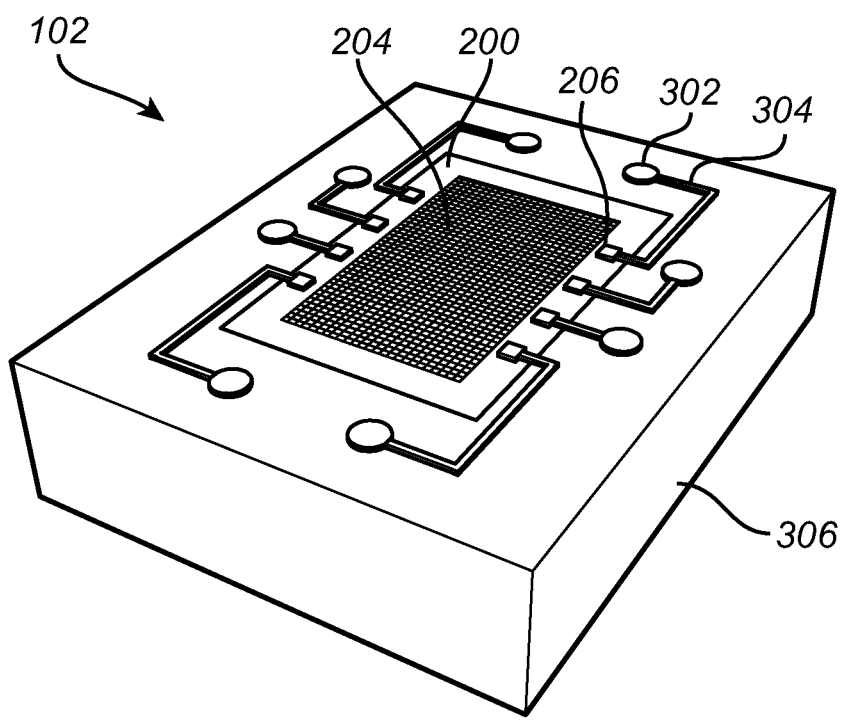
FIG. 7 schematically illustrates a fingerprint sensor module according to an embodiment of the invention.

FIG. 7 is a top view illustration of a fingerprint sensor module 102 after formation of the electrical connections 304 between the connection pads 206 and the via connections 310. Here it is illustrated that the via connections 302 are arranged symmetrically around the fingerprint sensor device 200.

Figure 8A:
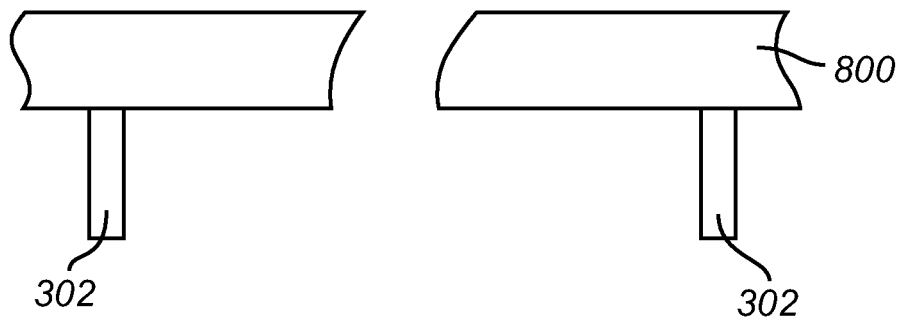
FIGS. 8A-B schematically illustrate steps of a manufacturing method according to an embodiment of the invention.
Figure 8B:
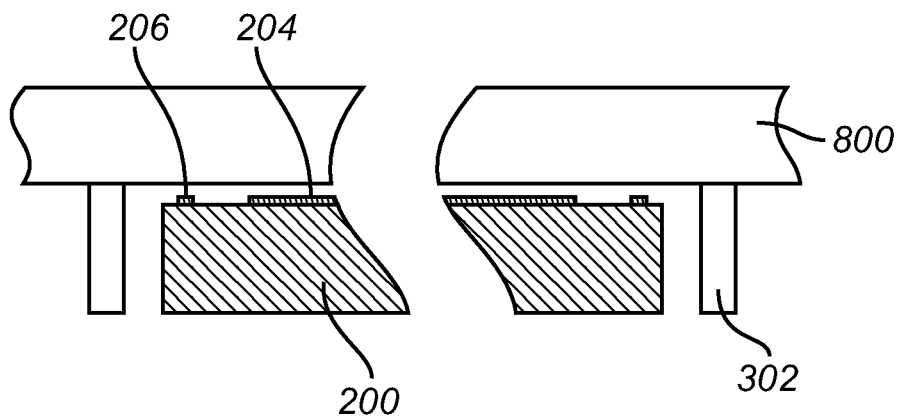

FIGS. 8A-B schematically illustrate selected steps of a manufacturing process according to another embodiment of the invention. As illustrated in FIG. 8A, the via connections are provided on a carrier 800 prior to arranging the fingerprint sensor device 200 on the carrier 800. The via connections may also be enclosed on the sides by a pre-formed mold layer 802.

FIG. 8B illustrates the carrier 800 of FIG. 8A with the fingerprint sensor device 200 arranged on the carrier 800 in between the pre-formed via connections. The subsequent steps of manufacturing the fingerprint sensor module 102 can then be performed in the same manner as described in relation to FIGS. 6A-D.

Figure 9A:
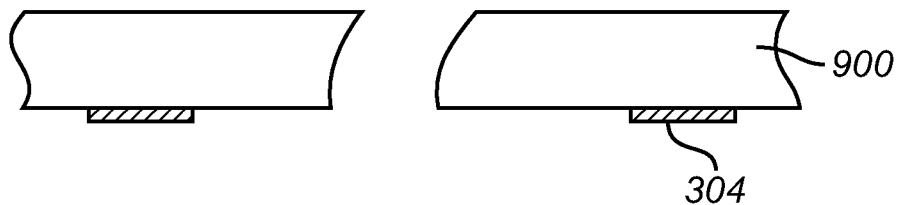
FIGS. 9A-B schematically illustrate steps of a manufacturing method according to an embodiment of the invention.
Figure 9B:
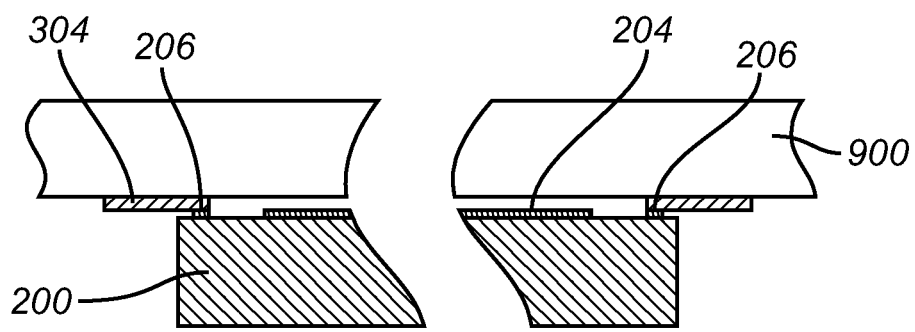

FIGS. 9A-B schematically illustrate selected steps of a manufacturing process according to another embodiment of the invention. In FIG. 9A, the electrical connections 304 for the fingerprint sensor device to a via connections have been formed on the carrier 900 prior to arranging the fingerprint sensor device on the carrier 900.

FIG. 9B illustrates the carrier 900 with the fingerprint sensor device 200 arranged thereon such that the connections pads 206 of the fingerprint sensor device 200 contact the electrical connections 304 already present on the carrier 900.

The cover structure 800, 900 illustrated in FIGS. 8A-B and 9A-B may for example be a protective plate to be used in the final fingerprint sensor module 102.

Moreover it is also possible to combine the pre-formed via connections 302 illustrated in FIG. 8A with the pre-formed electrical connections 304 illustrated in FIG. 9A, such that the via connections 302 are either formed directly in contact with the electrical connections 304 or other wise arranged directly in contact with the electrical connections 304.

Even though the invention has been described with reference to specific exemplifying embodiments thereof, many different alterations, modifications and the like will become apparent for those skilled in the art. Also, it should be noted that parts of the module and method may be omitted, interchanged or arranged in various ways, the module and method yet being able to perform the functionality of the present invention.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

What is claimed is:

1. A fingerprint sensor module comprising:
a fingerprint sensor device comprising a sensing array and at least one connection pad for electrically connecting the fingerprint sensor device to external circuitry, said sensing array and connection pad being located on a first side of the fingerprint sensor device;
a plurality of electrically conductive via connections arranged adjacent to the fingerprint sensor device and in electrical contact with the connection pad via at least one conductive trace located in the same plane as said connection pad, wherein via connections are arranged on at least two opposing sides of the fingerprint sensor device;
a mold layer arranged to cover a backside of said fingerprint sensor device and to fill a volume between the fingerprint sensor device and the via connection and enclosing the via connection, wherein an end portion of said via connection is exposed for connecting said fingerprint sensor module to external circuitry, wherein a height of said at least one electrically conductive via connection is lower than a combined thickness of the sensor device and the mold layer located on the backside of the sensor device such that said fingerprint sensor module exhibits a T-shaped profile.

2. The fingerprint sensor module according to claim 1, wherein a height of said electrically conductive via connections is equal to a thickness of said fingerprint sensor device.

3. The fingerprint sensor module according to claim 1, wherein said conductive trace is formed in a redistribution layer, RDL.

4. The fingerprint sensor module according to claim 1, wherein said electrically conductive via connections comprises copper.

5. The fingerprint sensor module according to claim 1, wherein said electrically conductive via connections are formed by means of electroplating.

6. The fingerprint sensor module according to claim 1, wherein said electrically conductive via connections are integrated in a pre-fabricated substrate.

7. The fingerprint sensor module according to claim 6, wherein the substrate is a PCB-substrate.

8. The fingerprint sensor module according to claim 1, wherein said electrically conductive via connections are pre-formed metal structures.

9. The fingerprint sensor module according to claim 1, wherein a cross section area of said electrically conductive via connections is larger than a surface area of said at least one connection pad of said fingerprint sensor device.

10. The fingerprint sensor module according to claim 1, wherein said mold layer comprises a mechanically flexible material.

11. The fingerprint sensor module according to claim 1, further comprising a protective plate arranged to cover the fingerprint sensor device and to form a sensing surface of the fingerprint sensor module.

12. A smart card comprising:
a fingerprint sensor module, comprising:
   a fingerprint sensor device comprising a sensing array and at least one connection pad for electrically connecting the fingerprint sensor device to external circuitry, said sensing array and connection pad being located on a first side of the fingerprint sensor device;
   a plurality of electrically conductive via connections arranged adjacent to the fingerprint sensor device and in electrical contact with the connection pad via at least one conductive trace located in the same plane as said connection pad, wherein via connections are arranged on at least two opposing sides of the fingerprint sensor device; and
   a mold layer arranged to cover a backside of said fingerprint sensor device and to fill a volume between the fingerprint sensor device and the via connection and enclosing the via connection, wherein an end portion of said via connection is exposed for connecting said fingerprint sensor module to external circuitry, wherein a height of said at least one electrically conductive via connection is lower than a combined thickness of the sensor device and the mold layer located on the backside of the sensor device such that said fingerprint sensor module exhibits a T-shaped profile,
wherein the fingerprint sensor module is arranged in an opening of the smart card and electrically connected to smart card circuitry by means of said at least one electrically conductive via connection.

13. A method for manufacturing a fingerprint sensor module, the method comprising:
providing a carrier;
providing a fingerprint sensor device comprising a sensing array and at least one connection pad for electrically connecting the fingerprint sensor device to external circuitry, said sensing array and connection pad being located on a first side of the fingerprint sensing device;
arranging the fingerprint sensor device on the carrier with the sensing array facing the carrier;
providing a plurality of electrically conductive via connections on the carrier adjacent to the fingerprint sensor device, wherein the via connections are arranged on at least two opposing sides of the fingerprint sensor device;
providing a mold layer to cover a backside of the fingerprint sensor device and to enclose the at least one electrically conductive via connection while leaving an end portion of the at least one electrically conductive via connection exposed, wherein a height of said at least one electrically conductive via connection is lower than a combined thickness of the sensor device and the mold layer located on the backside of the sensor device such that said fingerprint sensor module exhibits a T-shaped profile;
removing said carrier; and
forming an electrical connection between said at least one connection pad and said at least one at least one electrically conductive via connection.

14. The method according to claim 13, further comprising forming the electrically conducive via connections by electroplating.

15. The method according to claim 13, wherein the electrically conducive via connections are provided on the carrier prior to arranging the fingerprint sensor device on the carrier.

16. The method according to claim 13, wherein arranging a mold layer comprises:
depositing a mold layer to cover a backside of the fingerprint sensor and the electrically conductive via connections; and
removing a portion of the mold layer to expose at least an end portion of the electrically conductive via connections.

17. The method according to claim 16, wherein said portion of said mold layer is removed by means of laser ablation.

18. The method according to claim 13, further comprising arranging a mold layer by means of a patterned molding tool having a pattern such that a resulting mold does not cover the end portion of the electrically conductive via connections.

19. The method according to claim 13, wherein forming an electrical connection between said at least one connection pad and said electrically conductive via connections is performed by deposition of an electrically conductive redistribution layer, RDL.

* * * * *